United States Patent [19]

Isawa et al.

[11] 3,996,891
[45] Dec. 14, 1976

[54] LIQUID PHASE EPITAXIAL GROWTH APPARATUS WHEREIN CONTACTED WAFER FLOATS

[75] Inventors: Nobuyuki Isawa, Sagamihara; Kazuya Tanabe, Zama, both of Japan

[73] Assignee: Sony Corporation, Tokyo, Japan

[22] Filed: Feb. 27, 1975

[21] Appl. No.: 553,488

[30] Foreign Application Priority Data

Mar. 1, 1974 Japan .................................. 49-24637

[52] U.S. Cl. ............................... 118/423; 148/171; 427/84; 156/607; 156/622; 156/DIG. 70
[51] Int. Cl.² ..................... B05C 3/04; B01J 17/04
[58] Field of Search ............... 118/423, 425, 426; 148/171; 427/84–86, 88, 89; 156/621, 622, 620, 607, DIG. 70

[56] References Cited

UNITED STATES PATENTS

| | | | |
|---|---|---|---|
| 616,821 | 12/1898 | Bock | 156/622 |
| 2,414,679 | 1/1947 | West | 156/616 |
| 2,414,680 | 1/1947 | West | 156/616 |
| 2,759,803 | 8/1956 | Dauncey | 156/621 |
| 2,810,366 | 10/1957 | Weiskopf et al. | 118/425 |
| 3,460,510 | 8/1969 | Currin | 23/273 R |
| 3,463,680 | 8/1969 | Melngailis | 156/622 |
| 3,597,171 | 8/1971 | Knippenberg | 156/607 |
| 3,765,959 | 10/1973 | Unno | 156/622 |
| 3,783,825 | 1/1974 | Kobayashi | 156/622 |
| 3,854,447 | 12/1974 | Kobayashi | 156/622 |

Primary Examiner—Stephen J. Emery
Attorney, Agent, or Firm—Hill, Gross, Simpson, Van Santen, Steadman, Chiara & Simpson

[57] ABSTRACT

Apparatus for and methods of forming a liquid phase epitaxial growth layer on a semiconductor wafer by floating the wafer on a solution which forms the source of the epitaxial growth layer.

6 Claims, 3 Drawing Figures

U.S. Patent  Dec. 14, 1976  Sheet 1 of 2  3,996,891
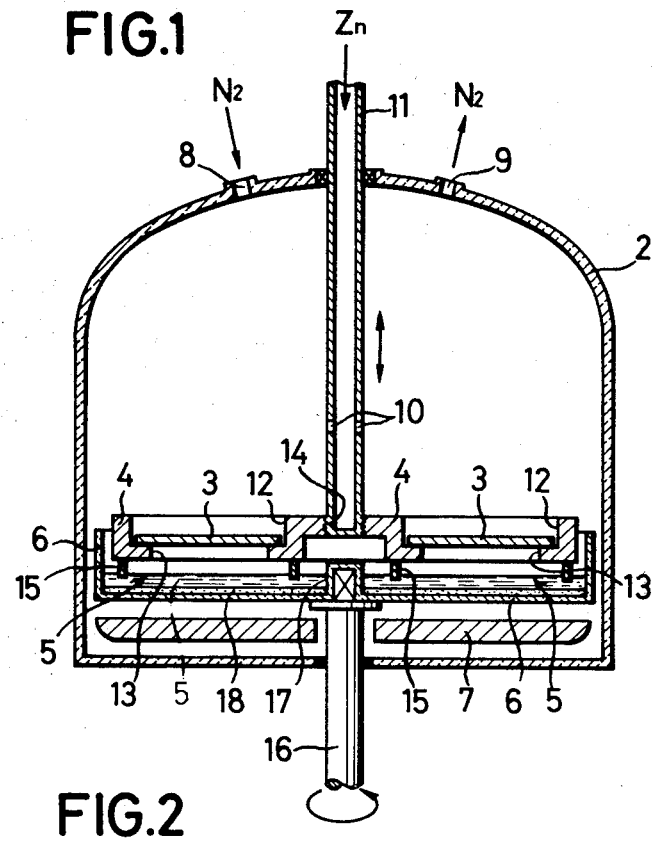
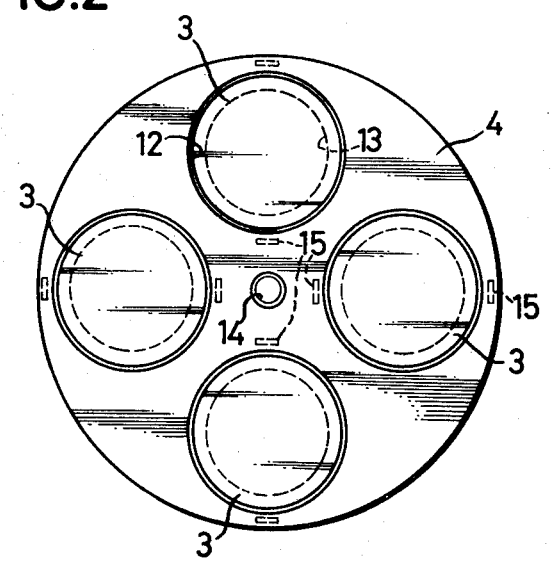

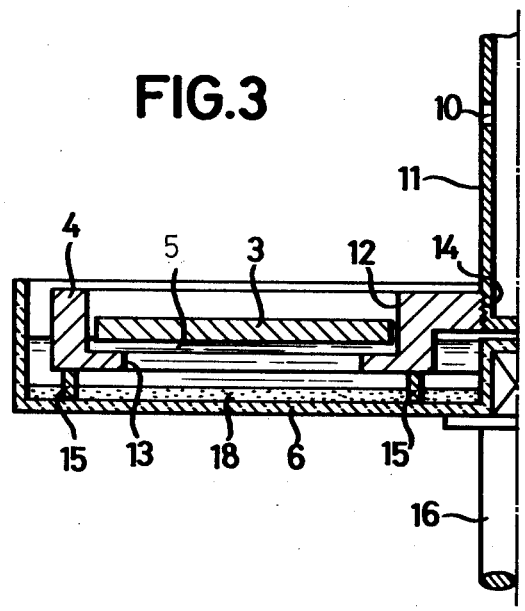

LIQUID PHASE EPITAXIAL GROWTH APPARATUS WHEREIN CONTACTED WAFER FLOATS

BACKGROUND OF THE INVENTION

1. Field of the Invention

This invention relates to apparatus for and methods of forming a liquid phase epitaxial growth layer, and more particularly, but not exclusively, to a liquid phase epitaxial growth apparatus for junction-type semiconductor devices such as light-emitting gallium phosphide (GaP) diodes.

2. Description of the Prior Art

Prior forms of such apparatus have made use of a dipping method, Nelson's method or a sliding method to cause liquid phase epitaxial growth.

In the dipping method, a semiconductor wafer is fixed on a holding plate. The semiconductor wafer and the holding plate are dipped lengthwide into a gallium-gallium phosphide solution to cause liquid-phase epitaxial growth on the semiconductor wafer. Since the specific gravity of GaP is smaller than that of Ga in the solution, the concentration of GaP decreases with the distance downward from the surface of the solution. Accordingly, a large quantity of GaP is required to form a sufficient epitaxial growth layer on the semiconductor wafer. This is costly. Moreover, since the depth of the solution must be greater than the length of the semiconductor wafer, a large quantity of the solution has to be used. In practice, too, it is impossible to form a uniform epitaxial growth layer on the semiconductor wafer, because the concentration of GaP and the temperature are not uniform throughout the solution. To form another epitaxial growth layer on the original epitaxial growth layer a further solution has to be used. Again, since the semiconductor wafers have to be fixed to the holding plate one by one, mass production and rapid operation are difficult.

Nelson's method also has the above-mentioned disadvantages. Moreover, if the solution is not sufficiently saturated with GaP, Nelson's method has the disadvantage that holes form in the semiconductor wafer due to erosion.

In the sliding method, the semiconductor wafer contacts only the portion of the solution with a lower concentration of GaP. Moreover, the length of the semiconductor wafer is limited to some extent.

SUMMARY OF THE INVENTION

One object of this invention is to provide a liquid phase epitaxial growth apparatus in which the quantity of solution necessary for liquid phase epitaxial growth and therefore the cost are reduced.

Another object of this invention is to provide a liquid phase epitaxial growth apparatus in which a semiconductor wafer can contact the surface of a solution, so that the difference between the temperature of the semiconductor wafer and the temperature of the surface of the solution is small, and thereby an epitaxial growth layer with uniform thickness can be formed on the semiconductor wafer.

A further object of this invention is to provide a liquid phase epitaxial growth apparatus which is suitable for the formation of a thick epitaxial growth layer, and with which the thickness of the epitaxial growth layer can be controlled.

A still further object of this invention is to provide a liquid phase epitaxial growth apparatus which can be used to form epitaxial growth layers different in concentration of impurity or in conductivity type, using a single solution.

A still further object of this invention is to provide a liquid phase epitaxial growth apparatus with which semiconductor wafers of various sizes can be rapidly treated and which is suitable for mass production.

The foregoing and other objects, features and advantages of the invention will be apparent from the following more particular description of preferred embodiments of the invention, as illustrated in the accompanying drawings.

BRIEF DESCRIPTION OF THE DRAWINGS

FIG. 1 is a cross-sectional view of a liquid phase epitaxial growth apparatus according to one embodiment of this invention;

FIG. 2 is a plan view of a holding member for holding semiconductor wafers in the apparatus of FIG. 1; and FIG. 3 is an enlarged cross-sectional view of a part of the apparatus of FIG. 1 showing a semiconductor wafer floating on the surface of the solution.

DESCRIPTION OF THE PREFERRED EMBODIMENTS

One embodiment of this invention will be described with reference to the drawings, which show a liquid phase epitaxial growth apparatus for manufacturing red-light emitting diodes.

Referring to FIG. 1, a liquid phase epitaxial growth apparatus comprises an air-tight bell jar 2 made of quartz, a holding member 4 made of quartz which is arranged in the bell jar 2 and holds N-type semiconductor wafers 3, a vessel 6 made of quartz which is arranged under the holding member 4 and contains a solution 5 for liquid phase epitaxial growth, and a heating means 7 made of graphite which is arranged under the vessel 6 and heats the solution 5.

An inlet 8 for nitrogen ($N_2$) gas and an outlet 9 for $N_2$ gas are formed in the upper portion of the bell jar 2. A feed pipe 11 made of stainless steel for feeding zinc (Zn) passes into the bell jar 2 through an air-tight packing. The feed pipe 11 is connected to the holding member 4 to form a unitary structure. Openings 10 for feeding Zn are made in the feed pipe 11.

Four circular recesses 12 are formed in the holding member 4 at angular intervals of 90° (FIG. 2). The semiconductor wafers 3 are supported in the recesses 12. Each recess 12 has a circular opening 13 in the bottom. The diameters of the circular openings 13 are slightly smaller than those of the recesses 12. The diameters of the semiconductor wafers 3 are slightly smaller than those of the recesses 12, but slightly larger than that of the openings 13.

A threaded aperture 14 is formed in the central portion of the holding member 4, and the lower end of the feed pipe 11 is screwed into this. The holding member 4 and therefore the feed pipe 11 are designed to be movable upward and downward relative to the bell jar 2. Projections 15 for stirring the solution 5 are formed on the lower surface of the holding member 4. Before operation of the apparatus, only the end portions of the projections 15 are dipped into the solution 5, and the semiconductor wafers 3 are maintained at a short distance from the surface of the solution 5.

A rotatable shaft 16 is fixed to the central portion of the bottom of the vessel 6 for rotating the vessel 6. A driving mechanism (not shown) is connected to the shaft 16 for rotating it. The vessel 6 has an annular recess 17 into which the holding member 4 can be inserted. Gallium sesquioxide ($Ga_2O_3$) 18 to provide light-emitting material and the solution 5, which is a Ga-GaP solution, are contained by the recess 17.

The operation of the above-described liquid phase epitaxial growth apparatus will now be described.

$N_2$ gas is fed into the bell jar 2 through the inlet 8, and the interior of the bell jar 2 is gradually heated up by the heating means 7. Zn vapor is fed into the bell jar 2 though the feed pipe 11. At the same time, the vessel 6 is rotated. As a result, Zn fed from the openings 10 and gallium mono-oxide ($Ga_2O$) from the $Ga_2O_3$ 18 melt into the Ga-GaP solution 5 in predetermined quantities, while the Ga-GaP solution 5 is stirred by the projections 15 so as to obtain a substantially uniform distribution both of composition and of temperature. As, however, the specific gravity of GaP is lower than that of Ga, the concentration of GaP is greater in the surface region of the Ga-GaP solution 5. Also, since the semiconductor wafers 3 are maintained in proximity to the surface of the Ga-GaP solution 5, there is no problem due to the non-uniform distribution of temperature in the vertical direction.

Next, the holding member 4 holding the semiconductor wafers 3 is moved down to be dipped into the Ga-GaP solution 5 which contains Zn and $Ga_2O$ and which is heated to about 1100° C (see FIG. 3). As a result, the semiconductor wafers 3 are floated on the surface of the Ga-GaP solution 5, which spreads into the recesses 12 of the holding member 4 through the openings 13, due to the surface tension of the Ga-GaP solution 5. Since the Ga-GaP solution 5 is continuously stirred by the projections 15, the Ga-GaP solution 5 is maintained substantially uniform and the formation of an oxide film on the surface of the Ga-GaP solution 5, which is common in previously proposed forms of apparatus, is avoided. In this embodiment satisfactory contact of the semiconductor wafers 3 with the surface of the Ga-GaP solution 5 is ensured.

With the above-described configuration, the Ga-GaP solution 5 is gradually cooled to 900° C. Epitaxial layers are formed on the surfaces of the semiconductor wafers 3 contacting the Ga-GaP solution 5. Since the concentration of GaP is larger in the upper portion of the Ga-GaP solution 5, the thickness of the P-type liquid phase epitaxial growth layer formed on each semiconductor wafer 3 is comparatively large, for example, about 100 microns. An epitaxial growth layer of such thickness can be used for numeral-display.

The holding member 4 is moved up from the Ga-GaP solution 5 when the epitaxial growth layer has been formed to a predetermined required thickness. The semiconductor wafers 3 are scooped up by the holding member 4 to return to the position shown in FIG. 1

Because the liquid phase epitaxial growth is effected on each semiconductor wafer 3 while the semiconductor wafer 3 is floating on the Ga-GaP solution 5, the semiconductor wafer 3 uniformly and satisfactorily contacts the Ga-GaP solution 5, and so the thickness of the epitaxial growth layer on the semiconductor wafer 3 is uniform. Also, as the liquid phase epitaxial growth is effected in the surface region of the Ga-GaP solution 5, which region has the larger concentration of GaP, the quantities of the Ga-GaP solution 5 and GaP can be reduced. This reduces the cost. Moreover, since the semiconductor wafers 3 are not fixed to the holding member 4, but are supported by the holding member 4 so that the semiconductor wafers 3 can float on the Ga-GaP solution 5, it is simple to mount the semiconductor wafers 3 on the holding member 4 and likewise simple to demount them. The time required for the total operation is reduced to about 30 minutes. Numerous semiconductor wafers 3 can be treated at the same time, and so the described apparatus is suitable for mass production.

Although one embodiment of this invention has been described, it will be understood that various modifications are possible on the basis of the technical concept of this invention.

For example, the thickness of the epitaxial growth layer can be controlled by scooping up the semiconductor wafers 3 from the Ga-GaP solution 5 during the liquid phase epitaxial growth. Thus, an N-type epitaxial growth layer can be formed on the semiconductor wafer 3 by the supply of N-type impurities, for example, phosphorus (P) from the feed pipe 11 and then a P-type epitaxial growth layer can be formed on the N-type epitaxial growth layer by the supply of Zn from the feed pipe 11. Thus, various semiconductive regions can be formed on the semiconductor wafer 3 without changing the Ga-GaP solution 5.

The rotatable shaft 16 may be tubular and connected to the feed pipe 11 so that the shaft 16 and/or the feed pipe 11 can be used for the supply of impurities. Alternatively the impurities, such as Zn, may be previously contained in the vessel 6.

A quartz screen 19 may be attached to the opening 13 of the holding member 4 so as to be parallel with the surface of the Ga-GaP solution 5. When the holding member 4 is dipped into the solution 5, the GaP film on the surface of the Ga-GaP solution 5 is broken by the quartz screen, and as a result, the semiconductor wafer 3 can more effectively contact with GaP in the surface region of the Ga-GaP solution 5, so the epitaxial growth layer can be made thicker.

The openings 13 can be of various sizes, so that epitaxial growth layers can be formed on semiconductor wafers of various sizes at the same time.

Before beginning the epitaxial growth, etchant vapor may be supplied into the bell jar 2 for the purpose of removing contamination on the surface of the semiconductor wafers 3, for example, Ga stuck thereon.

Instead of the holding member 4, a circular holding plate having openings corresponding to the openings 13 may be fixed to the inner wall of the vessel 6. The semiconductor wafers 3 are positioned on the circular holding plate, over the openings. The Ga-GaP solution 5 is then supplied into the vessel 6 and the semiconductor wafers 3 floated on the surface of the Ga-GaP solution 5 due to the surface tension.

Instead of the recess 17, two annular recesses may be concentrically formed in the vessel 6. Solutions with different quantities of GaP are contained by the outside annular recess and by the inside annular recess. Openings 13 are made along two circles, corresponding to the two annular recesses, in the holding member 4. The semiconductor wafers 3 are mounted in the holding member 4 as before. In this way epitaxial growth layers of different thickness can be formed on semiconductor wafers arranged along the outside circle and on semiconductor wafers arranged along the inside circle, respectively.

Besides GaP, group III-V compounds such as gallium arsenide (GaAs), indium phosphide (InP) and gallium-aluminum arsenide (GaAlAs) may be used as the material of the semiconductor wafer. Instead of $Ga_2O$, ammonia ($NH_3$) or hydrogen sulphide ($H_2S$) for green light may be supplied as the light emitting material. In that case, it is preferable that the vessel 6 is made of graphite or glassy carbon.

The invention can be applied to various light-emitting diodes formed by the combination of different light emitting materials and different impurities. However, the invention is not limited to light-emitting diodes, but can be applied to various semiconductor devices doped with impurities.

According to this invention, the holding member is prepared for holding the semiconductor wafers. When the holding member is dipped into the solution for liquid phase epitaxial growth, the semiconductor wafers float on the surface of the solution. Since the concentration of the material to be epitaxially grown, for example, GaP is higher in the surface region of the solution, the material to be epitaxially grown can be effectively used for the epitaxial growth layer. Accordingly, the quantities of the material and solution can be greatly reduced. Moreover, since the semiconductor wafer is floated on the solution, the former can sufficiently contact with the latter, and the difference between the temperature of the semiconductor wafer and the temperature of the surface of the solution is negligibly small. Accordingly, an epitaxial growth layer with uniform thickness can be formed on the semiconductor wafer.

An epitaxial growth layer of one conductivity type can be formed on an epitaxial growth layer of the other conductivity type from a single solution by scooping the semiconductor wafer from the solution to interrupt the liquid phase epitaxial growth on the semiconductor wafer for a time, and then again dipping the holding member into the solution after supplying different impurities into the solution.

Moreover, since the semiconductor wafer is not fixed to the holding member, the semiconductor wafer can easily be mounted on the holding member and easily demounted from the holding member. It is possible rapidly to treat semiconductor wafers of various sizes. Accordingly, the apparatus is suitable for mass production.

It will be understood that other modifications and variations can be effected without departing from the present invention, the scope of which is defined by the appended claims.

We claim:

1. A liquid phase epitaxial growth apparatus comprising:
    a vessel for containing a solution as a source of material for liquid phase epitaxial growth; holding means for holding at least one semiconductor wafer on which semiconductor wafer an epitaxial growth layer is to be formed; an air-tight container within which said vessel and said holding means are disposed; means for rotating said vessel in a horizontal plane;
    said holding means including a hollow carrier proportioned to receive a semiconductor wafer in loosely fitting relation; and
    means for effecting movement of said holding menas in a vertical direction with respect to the surface of said solution so that said holding means dips into said solution, said semiconductor wafer floats on the surface of said solution while still confined within said hollow carrier, and said epitaxial growth layer is formed on said floating semiconductor wafer.

2. A liquid phase epitaxial growth apparatus according to claim 1 further comprising a stirring means attached to said holding means, said stirring means stirring said solution when said holding means is dipped into said solution.

3. A liquid phase epitaxial growth apparatus according to claim 1 further comprising a pipe for supplying required impurities into said air-tight container, said pipe being fixed to said holding means.

4. A liquid phase epitaxial growth apparatus according to claim 1 further comprising means to maintain an inert gas atmosphere in said air tight container, and a heating means disposed in said bell jar under said vessel.

5. A liquid phase epitaxial growth apparatus according to claim 1 wherein said means for rotating said vessel comprises a cylindrical shaft, said shaft having a passage for supplying required impurities into said air-tight container.

6. A liquid phase epitaxial growth apparatus according to claim 1 further comprising a screening means fixed at said opening, said screening means breaking any surface film on the surface of said solution when said holding means is dipped into said solution.

* * * * *